(12) United States Patent
Fuller et al.

(10) Patent No.: US 10,814,629 B2
(45) Date of Patent: Oct. 27, 2020

(54) TERMINATION RING WITH GAPPED METALLIC LAYER

(71) Applicant: HEWLETT-PACKARD DEVELOPMENT COMPANY, L.P., Fort Collins, CO (US)

(72) Inventors: Anthony M Fuller, Corvallis, OR (US); Terry McMahon, Corvallis, OR (US); Donald W Schulte, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 42 days.

(21) Appl. No.: 16/305,528

(22) PCT Filed: Sep. 19, 2016

(86) PCT No.: PCT/US2016/052430
§ 371 (c)(1),
(2) Date: Nov. 29, 2018

(87) PCT Pub. No.: WO2018/052445
PCT Pub. Date: Mar. 22, 2018

(65) Prior Publication Data
US 2020/0269581 A1  Aug. 27, 2020

(51) Int. Cl.
*B41J 2/14* (2006.01)
*B41J 2/155* (2006.01)

(52) U.S. Cl.
CPC .............. *B41J 2/155* (2013.01); *B41J 2/1433* (2013.01); *B41J 2/14072* (2013.01); *B41J 2002/14491* (2013.01); *B41J 2202/13* (2013.01)

(58) Field of Classification Search
CPC ............... B41J 2/14072; B41J 2202/13; B41J 2002/14491; B41J 2/145; B41J 2/155; B41J 2/1433; B41J 2/1635; B41J 2/14016
See application file for complete search history.

(56) References Cited

U.S. PATENT DOCUMENTS 5,767,881 A   6/1998  Geissmann
6,331,049 B1  12/2001  Leban
(Continued)

FOREIGN PATENT DOCUMENTS

CN    1734764    2/2006
CN   100585860   6/2007
(Continued)

OTHER PUBLICATIONS

Tay, A.O.O., Effects of Moisture and Delamination on Cracking of Plastic IC Packages During Solder Reflow, May 28-31, 1996.

*Primary Examiner* — Henok D Legesse
(74) *Attorney, Agent, or Firm* — Fabian VanCott (57) ABSTRACT

In one example in accordance with the present disclosure, a fluid ejection device is described. The fluid ejection device includes a substrate and a number of nozzles formed within the substrate to eject fluid. A number of bond pads are disposed on the substrate and are electrically coupled to the number of rows of nozzles. A termination ring is disposed on the substrate and surrounds the rows of nozzles. The termination ring includes a first metallic layer that is an enclosed shape and a second metallic layer that is disposed on top of the first metallic layer. The second metallic layer includes a gap positioned adjacent the number of bond pads.

15 Claims, 5 Drawing Sheets

(56) References Cited

U.S. PATENT DOCUMENTS

| | | | |
|---|---|---|---|
| 6,566,736 B1 | 5/2003 | Ogawa et al. | |
| 8,093,719 B1 * | 1/2012 | Parhami | H01L 23/562 |
| | | | 257/730 |
| 8,836,133 B2 | 9/2014 | Huang et al. | |
| 8,870,337 B1 * | 10/2014 | Jensen | B41J 2/01 |
| | | | 347/19 |
| 8,937,007 B2 | 1/2015 | Watanabe et al. | |
| 9,059,033 B2 | 2/2015 | Saigoh et al. | |
| 9,070,683 B2 | 6/2015 | Fender et al. | |
| 2003/0160261 A1 | 8/2003 | Moriya | |
| 2005/0127395 A1 | 6/2005 | Saigoh | |
| 2006/0012012 A1 | 1/2006 | Wang | |
| 2013/0009663 A1 * | 1/2013 | Gauch | H01L 22/34 |
| | | | 324/762.01 |

FOREIGN PATENT DOCUMENTS

| | | |
|---|---|---|
| CN | 102208334 | 10/2011 |
| CN | 102381044 | 3/2012 |
| CN | 103839925 | 6/2014 |
| EP | 1034932 | 9/2000 |
| EP | 2864123 | 4/2015 |
| JP | 2005175204 | 6/2005 |
| JP | 2006319040 | 11/2006 |
| JP | 2009253025 | 10/2009 |
| JP | 2012020451 | 2/2012 |
| JP | 2015101075 | 6/2015 |
| RU | 2490139 C2 | 8/2013 |
| WO | WO-2014051540 | 4/2014 |
| WO | WO-2016068921 A1 | 5/2016 |

* cited by examiner

TERMINATION RING WITH GAPPED METALLIC LAYER

BACKGROUND

Fluid ejection devices such as inkjet printheads are widely used for precisely, and rapidly, dispensing small quantities of fluid. Such fluid ejection devices come in many forms. For example, fluid ejection devices may dispense fusing agent in an additive manufacturing process or may be used to dispense ink on a print medium such as paper.

BRIEF DESCRIPTION OF THE DRAWINGS

The accompanying drawings illustrate various examples of the principles described herein and are part of the specification. The illustrated examples are given merely for illustration, and do not limit the scope of the claims.

Throughout the drawings, identical reference numbers designate similar, but not necessarily identical, elements.

DETAILED DESCRIPTION

Fluid ejection devices allow for the precise ejection of small quantities of fluid onto a surface. Fluid ejection devices are used in different systems. For example, in an additive manufacturing apparatus a fluid ejection device may dispense fusing agent. In another example, a fluid ejection device may be a printhead used to dispense ink on a print medium such as paper. Droplets of fluid are ejected out of a nozzle orifice by creating a short pulse of high pressure within a firing chamber. An ejector in the firing chamber forces the fluid out the nozzle orifice. Examples of nozzles include thermal ejectors or piezoelectric ejectors. Specifically, a thermal ejector uses a semiconductor device including a heating element (e.g., resistor) in the firing chamber along with other integrated circuitry. To eject a droplet of fluid, an electrical current is passed through the resistor. As the resistor generates heat, a small portion of the fluid within the firing chamber is vaporized. The vapor rapidly expands, forcing a small droplet out of the firing chamber through the nozzle orifice. The electrical current is then turned off and the resistor cools. The vapor bubble rapidly collapses, drawing more fluid into the firing chamber from a fluid reservoir.

The nozzles may be arranged in columns or arrays such that properly sequenced ejection of fluid from the nozzles causes characters, symbols, and/or other patterns to be formed on the surface. The surface may be a layer of build material in an additive manufacturing apparatus or a medium such as paper in an inkjet printer. In operation, fluid flows from a reservoir to the fluid ejection device. In some examples, the fluid ejection device may be broken up into a number of dies with each die having a number of nozzles. To create the characters, symbols, and/or other patterns, a printer or other component in which the fluid ejection device is installed sends electrical signals to the fluid ejection device via electrical bond pads on the fluid ejection device. The fluid ejection device then ejects a small droplet of fluid from the reservoir onto the surface. These droplets combine to form an image or other pattern on the surface.

The fluid ejection device includes a number of components for depositing a fluid onto a surface. For example, the fluid ejection device includes a number of nozzles. A nozzle includes an ejector, a firing chamber, and a nozzle orifice. The nozzle orifice allows fluid, such as ink or a fusing agent, to be deposited onto a surface, such as powder build material or a print medium. The firing chamber includes a small amount of fluid. The ejector is a mechanism for ejecting fluid through the nozzle orifice from a firing chamber. The ejector may include a firing resistor or other thermal device, a piezoelectric element, or other mechanism for ejecting fluid from the firing chamber.

For example, the ejector may be a firing resistor. The firing resistor heats up in response to an applied voltage. As the firing resistor heats up, a portion of the fluid in the firing chamber vaporizes to form a bubble. This bubble pushes liquid fluid out the nozzle orifice and onto the surface. Once the bubble has formed and a fluid droplet has been ejected, the voltage applied to the resistor is turned off and the resistor cools. As the resistor cools, the vapor bubble collapses in the firing chamber. Capillary forces then draw fluid into the firing chamber from the fluid supply, and the process may repeat.

In another example, the ejector may be a piezoelectric device. As a voltage is applied, the piezoelectric device changes shape which generates a pressure pulse in the firing chamber that pushes a fluid out the nozzle orifice and onto the surface.

While such fluid ejection devices undoubtedly have advanced the field of precise fluid delivery, some conditions may affect their effectiveness. For example, a termination ring may be disposed around the nozzles to act as electrostatic protection for the fluid ejection device and to reduce ground noise on the device. The termination ring also serves as a way to terminate the thin film layers that form the substrate in a controlled manner such that cracks that may form during separation of an individual fluid ejection device do not propagate into the body of the fluid ejection device. In other words, the termination ring provides a chemical and electrical protection of the components of the fluid ejection device, i.e., nozzle, bond pads, etc., while preventing delamination of the fluid layers that can be in compressive stress.

During formation of the fluid ejection device, a top metal wear layer is deposited over the device surface and patterned to form a protective wear layer over a brittle top dielectric layer. The dielectric layer is used to passivate the device substrate and heater resistors. With the exception of the fluidic region of the die and bond pads, a majority of the wear layer is then removed through a patterning and etch step. However, in this process, a stringer of excess metallic material can be left along the sides of metal traces and the termination ring. This metal stringer can cause a variety of moisture-related failures of the fluid ejection device. For example, an observed failure in some fluid ejection devices is a moisture related short between two bond pads, wherein each of the affected bond pads shorts to the metal stringer along the termination ring edge via moisture and the stringer completes the short between the two pads.

Electrical connection to the device components is made via wire bonds or TAB bonding a flexible circuit to the die bond pads. The flexible circuit is made of electroformed copper traces sandwiched between protective layers with an adhesive material to bond the outer layers together. The presence of moisture in the bond pad region can lead to corrosion of the wire bonds or flex circuit traces and damage to the flex circuit materials. As a specific example, the adhesive layer can delaminate in the presence of moisture in the bond area of the device. This corrosion and damage can lead to failure of the printing assembly.

Accordingly, the present specification describes devices and methods that may alleviate these and other complications. Specifically, a portion of an uppermost metallic layer of the termination ring is removed in a region surrounding the bond pads. By removing this particular portion of the layer, the die surface topography and thereby, the formation of the excess material, i.e., the "stringer," is reduced. This stringer can provide a shortened conduction path between adjacent electrical components leading to their failure. Accordingly, the removal of this stringer near electrical components such as bond pads reduces the likelihood of such a short and other moisture-related failures of the fluid ejection device.

Specifically, the present specification describes a fluid ejection device. The fluid ejection device includes a substrate and a number of rows of nozzles formed within the substrate to eject fluid. A number of bond pads are disposed on the substrate and are electrically coupled to the number of rows of nozzles. A termination ring is disposed on the substrate and surrounds the number of rows of nozzles. The termination ring includes a first metallic layer that is an enclosed shape and a second metallic layer disposed on top of the first metallic layer. The second metallic layer has a gap positioned adjacent the number of bond pads.

The present specification also describes a method of forming a termination ring on a fluid ejection device. According to the method, an enclosed first metallic layer is disposed on a substrate of the fluid ejection device. An enclosed second metallic layer is then formed on top of the enclosed first metallic layer. A portion of the enclosed second metallic layer is then removed. The removed portion coincides with a bond pad region of the fluid ejection device.

The present specification describes a fluid ejection device. The fluid ejection device includes a substrate and a number of rows of nozzles formed within the substrate to eject fluid. A number of bond pads are disposed on the substrate and electrically couple the number of rows of nozzles to a controller. A termination ring is disposed on the substrate and surrounds the number of rows of nozzles and the number of bond pads. The termination ring mechanically and electrically protects the number of rows of nozzles. The termination ring includes a bond pad region that includes just a first metallic layer. The termination ring also includes a non-bond pad region that includes the first metallic layer and a second metallic layer that is disposed on the first metallic layer.

In one example, using such a gapped termination ring provides the electrical, mechanical, and chemical protection to internal components of the fluid ejection device, but also reduces the formation of metal stringers, which could provide a short path to the bond pad, which short path could result in multiple failure mechanism for the fluid ejection device. However, it is contemplated that the devices disclosed herein may address other matters and deficiencies in a number of technical areas.

As used in the present specification and in the appended claims, the term "nozzle" refers to an individual component of a fluid ejection device that dispenses fluid onto a surface. The nozzle includes at least a firing chamber, an ejector, and a nozzle orifice.

As used in the present specification and in the appended claims, the term "a number of" or similar language is meant to be understood broadly as any positive number including 1 to infinity.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language indicates that a particular feature, structure, or characteristic described in connection with that example is included as described, but may not be included in other examples.

Figure 1:
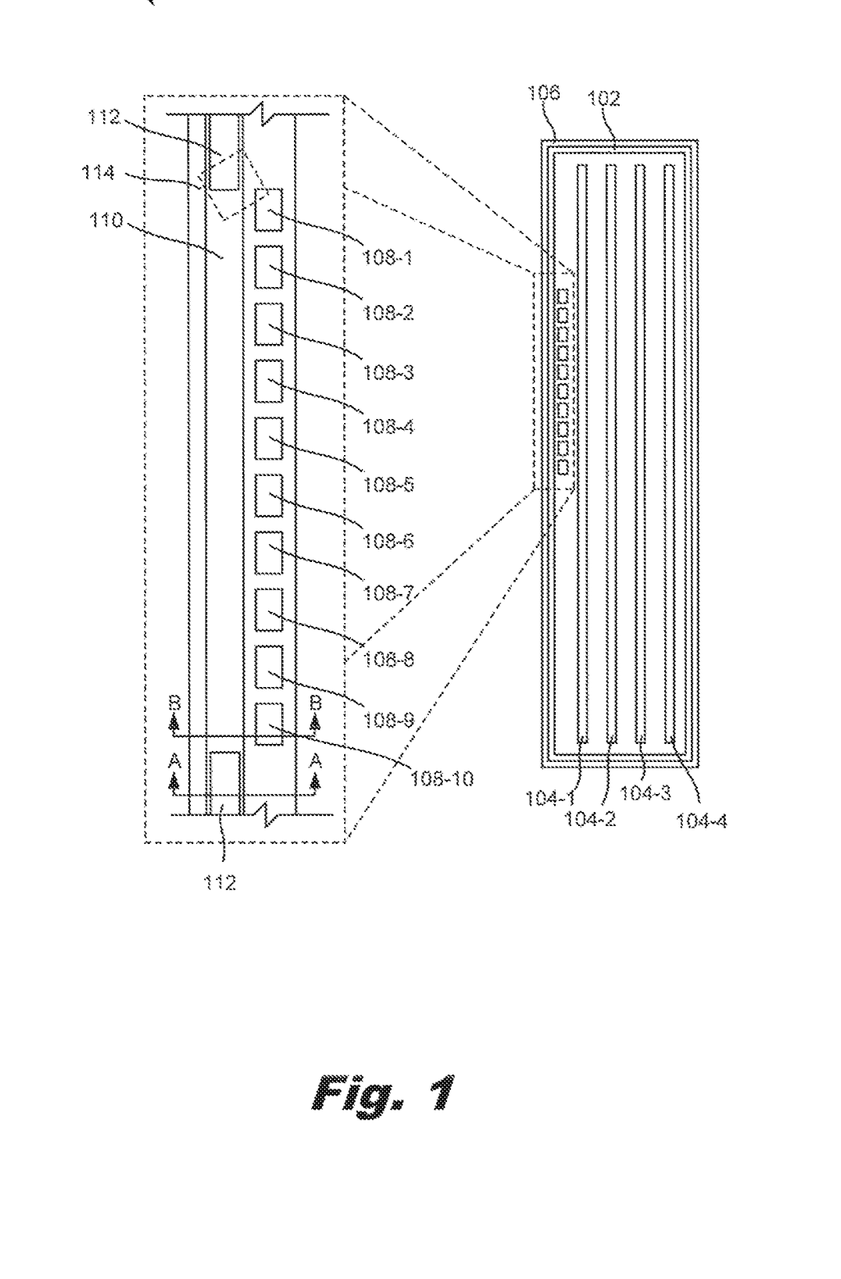
FIG. 1 is a top view of a fluid ejection device with a gapped termination ring, according to an example of the principles described herein.

FIG. 1 is a top view of a fluid ejection device (100) with a gapped termination ring (102), according to an example of the principles described herein. As described above, the fluid ejection device (100) may be used to precisely, accurately, and quickly deposit fluid onto a surface. The surface may be a media such as paper in which case the fluid is ink. In another example, the surface may be a powdered build material that is used in additive manufacturing. In this case, the fluid is a fusing agent that increases the absorption of the underlying powder build material such that it can be fused by infrared energy to form a layer of a three-dimensional object. In other examples, the fluid may be a genetic solution implemented in bio-chemical operations. In other examples, the fluid ejection device may be implemented in a lab-on-a-chip device to facilitate precision (e.g., picoliter scale) pumping and/or mixing of fluids.

Accordingly, the fluid ejection device (100) includes rows (104-1, 104-2, 104-3, 104-4) of nozzles. Each nozzle includes a firing chamber that holds an amount of fluid, a nozzle orifice through which the fluid is dispensed, and an ejector that forces the fluid out the firing chamber through the nozzle orifice. While FIG. 1 depicts four rows (104-1, 104-2, 104-3, 104-4), any number of rows may be present on the fluid ejection device (100). Moreover, for simplicity individual nozzles are not depicted in FIG. 1. The substrate (106) may be formed of multiple thin film layers composed of any number of materials including, silicon, polymers, and glass. The nozzles of the rows (104) may be formed in a substrate (106) of the fluid ejection device (100) through successive operations of depositing, masking, and etching.

The fluid ejection device (100) also includes a number of bond pads (108-1, 108-2, 108-3, 108-4, 108-5, 108-6, 108-7, 108-8, 108-9, 108-10). While ten bond pads (108) are depicted in FIG. 1, any number of bond pads (108) may be present on the fluid ejection device (100). The bond pads (108) are electrically coupled to the number of rows (104) of nozzles and electrically couple the number of rows (104) of nozzles to a controller. For example, as described above, during operation a controller sends electrical impulses that cause subsets of the ejectors to activate and force a droplet of the fluid through the corresponding nozzle orifice. This signal is passed from the controller to the individual rows through the bond pad (108).

The fluid ejection device (100) also includes a termination ring (102). The termination ring (102) is disposed on the substrate (106). In some examples, the termination ring (102) surrounds the rows (104) of nozzles and in some cases, the number of bond pads (108) as well. For example, as depicted in FIG. 1, the number of bond pads (108) may be disposed along an edge of the substrate (106) and the termination ring (102) runs along the number of bond pads (108) between the bond pads (108) and the edge of the substrate (106).

The termination ring (102) serves many purposes. One purpose is to provide electrostatic protection of the components that are interior to the termination ring (102), i.e., the fluid ejection circuitry, nozzles, and bond pads (108). In other words, the termination ring (102) provides a low resistance grounded path surrounding the fluid ejection components. The termination ring (102) shunts any electrostatic discharge that strikes an edge of the device to ground through the termination ring (102), thereby directing those potentially damaging electrostatic discharges away from sensitive internal circuitry. In this example, the metallic layers of the termination ring (102) are coupled to the substrate (106) providing an electrical ground for the fluid ejection device (100).

Another purpose of the termination ring (102) is to provide mechanical robustness to the fluid ejection device (100). For example, during manufacturing, multiple fluid ejection devices (100) may be formed on a single sheet of the substrate (106). The individual fluid ejection devices (100) are then singulated and distributed. During singulation, microfractures or cracks could form around the edges of the individual fluid ejection devices (100). The termination ring (102) prevents these microfractures or microcracks from propagating into the portion of the fluid ejection device (100) that retains other components such as the nozzles, bond pads (108), and associated circuitry.

The termination ring (102) includes multiple layers of metallic material. Specifically, the termination ring (102) includes a first metallic layer (110). The first metallic layer (110) is an enclosed shape that surrounds the rows (104) of nozzles and/or the number of bond pads (108). The first metallic layer (110) may be formed of any metal or metal alloy such as Aluminum, Aluminum Copper, or Tantalum Aluminum, in addition to other metals and metal alloys.

The termination ring (102) also includes a second metallic layer (112) that is disposed on top of the first metallic layer (110). Like the first metallic layer (110), the second metallic layer (112) may be formed of any metal or metal alloy such as Aluminum, Aluminum Copper, or Tantalum Aluminum, in addition to other metal and metal alloys.

The second metallic layer (112) includes a gap that is positioned adjacent the number of bond pads (108). That is, the second metallic layer (112) surrounds the number of rows (104) of nozzles, except around the bond pad region. The bond pad region may be that portion of the first metallic layer (110) that is adjacent to the bond pads (108). In other words, the termination ring (102) includes a bond pad region that is adjacent to the bond pads (108). The bond pad region of the termination ring (102) includes just the first metallic layer (110) while a non-bond pad region of the termination ring (102), which includes the portions of the termination ring (102) that are not adjacent to the bond pads (108), includes both the first metallic layer (110) and the second metallic layer (112). Put yet another way, the gap in the second metallic layer (112) of the termination ring (102) may be the same length as the array of bond pads (108).

Having a termination ring (102) with the second metallic layer (112) removed from a region adjacent to the bond pads (108) reduces the risk of failure due to moisture-related complications. For example, metal stringers may form adjacent to the second metallic layer (112) during the deposition of the bond pad (108). These stringers provide a conduction path between adjacent bond pads (108) and between the metallic termination ring (102) and the bond pads (108). This conduction path, in the presence of moisture, can result in shorts that render the fluid ejection device (100) unusable.

Figure 2:
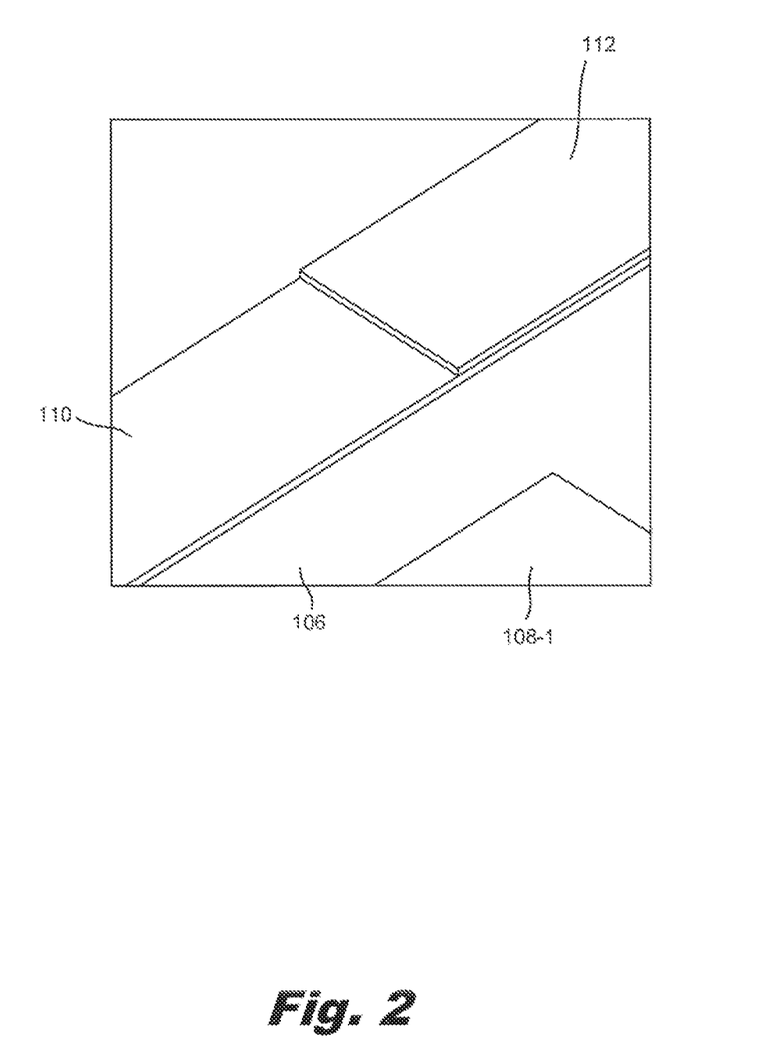
FIG. 2 is a zoomed-in isometric view of a portion of the gapped termination ring, according to an example of the principles described herein.

FIG. 2 is a zoomed-in isometric view of a portion of the gapped termination ring (FIG. 1, 102), according to an example of the principles described herein. Specifically, FIG. 2 is that portion indicated by the box (FIG. 1, 114) in FIG. 1. As can be seen in FIG. 2, the second metallic layer (112) stops where the bond pad region, or that region defined on the fluid ejection device (FIG. 1, 100) as including the bond pads (108), begins. In contrast, the first metallic layer (110) is present in this bond pad region. As will be seen in FIG. 3, removing this portion of the second metallic layer (112) from the termination ring (FIG. 1, 102) prevents the formation of metallic stringers along an edge of the termination ring (FIG. 1, 102), which stringers are vehicles for failure of the fluid ejection device (FIG. 1, 100).

Figure 3A:
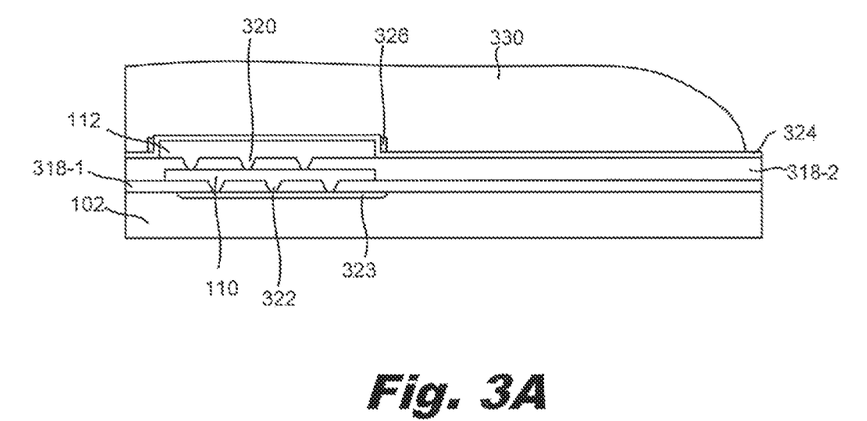
FIGS. 3A and 3B are cross-sectional views of the fluid ejection device with the gapped termination ring, according to an example of the principles described herein.
Figure 3B:
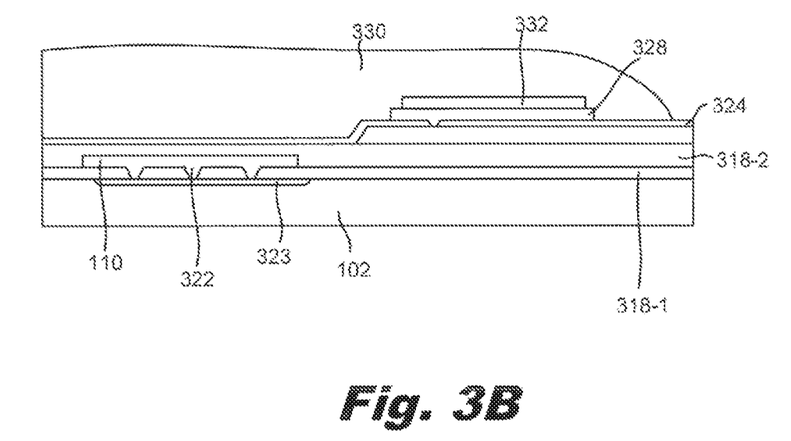

FIGS. 3A and 3B are cross-sectional views of the fluid ejection device (FIG. 1, 100) with the gapped termination ring (FIG. 1, 102), according to an example of the principles described herein. Specifically, FIG. 3A is a cross-sectional diagram taken along the line A-A in FIG. 1, and FIG. 3B is a cross-sectional diagram taken along the line B-B in FIG. 1. FIG. 3A depicts the stringers (326) that may be undesirable to have adjacent to a bond pad (108). Specifically, FIG. 3A depicts the substrate (106) which provides a surface on which components of the fluid ejection device (FIG. 1, 100) are disposed. FIG. 3A depicts a non-bond pad region of the termination ring (FIG. 1, 102). In such a non-bond pad region, the termination ring (FIG. 1, 102) includes the first metallic layer (110) and the second metallic layer (112).

The first metallic layer (110) and the second metallic layer (112) may be disposed in layers of dielectric materials (318-1, 318-2) to insulate them from surrounding components. The dielectric layers (318-1, 318-2) may be formed of any dielectric material including TEOS and silicon dioxide.

The first metallic layer (110) includes contacts (322) that pass through to the substrate (102) and the second metallic layer (112) includes vias (320) that electrically couple the second metallic layer (112) to the first metallic layer (110). For simplicity, one instance of each of a contact (322) and a via (320) is indicated with a reference number. In some examples, the first metallic layer (110) is coupled to a diffusion region (323) in the substrate (106). The diffusion region (323) may include a heavily doped implant such as boron to create a low resistance contact between the first metallic layer (110) and the substrate (106).

The structure as described herein, i.e., two metallic layers (110, 112) and corresponding vias (320) and contacts (322), facilitates a common ground for the fluid ejection device (FIG. 1, 100) thus protecting the components of the fluid ejection device (FIG. 1, 100) against electrostatic discharge. The structure also provides mechanical robustness as cracks that could develop during singulation of individual fluid ejection devices (FIG. 1, 100) are prevented from propagating inward towards, and potentially damaging, other components such as nozzles, bond pads (108), and other circuitry.

Disposed on top of the termination ring (FIG. 1, 102) is a passivation layer (324). The passivation layer (324) protects underlying components from corrosion. The passivation layer (324) also may be formed of any number of materials including silicon carbide or silicon nitride.

As noted above, FIG. 3A also depicts the metallic stringers (326) that may be undesirable adjacent to the bond pads (108). The stringers (326) are formed as a byproduct of forming the bond pads (108). Specifically, during formation of the bond pads (108) which are depicted in FIG. 3B, a metallic material such as tantalum is deposited across the entire surface of the passivation layer (324). During a masking and etching process, the material is removed from the passivation layer (324) except as desired to form a first layer (328) of the bond pad (108). However, as can be seen in FIG. 3A, there exists a vertical ridge in the passivation layer (324) as it passes over the side of the second metallic layer (112). The stringer (326) formed along the vertical edge of that passivation layer (324) is left over after the etching to form the first layer (328) of the bond pad. Were this stringer (326) to remain in the bond pad region, a conduction path would exist between the termination ring (FIG. 1, 102) and the bond pad (108), thus resulting in a potential failure of the fluid ejection device (FIG. 1, 100). Specifically, as moisture were to ingress through the encapsulant (330), this stringer (326) would form a short conduction path between bonding pads (108) leading to failure of the fluid ejection device (FIG. 1, 100). These stringers (326) if left in the bond pad region can also facilitate bond pad to bond pad failure. More specifically, while bond pad (108) spacing is distant enough that shorting is not likely between bond pads (108), the spacing between the termination ring (FIG. 1, 102) and the bond pads (108) is shorter and therefore creates a short electrical path between adjacent bond pads.

The presence of the stringers (326) in the non-bond pad region is acceptable due to the lack of electrical components on other portions of the fluid ejection device (FIG. 1, 100). In other words, it is desirable for the stringers (326) to be removed from the bond pad region due to the electrical activity that occurs in that region.

In some examples, the fluid ejection device (FIG. 1, 100) also includes an encapsulant (330) disposed over the number of bond pads (108) and a portion of the termination ring (FIG. 1, 102). The encapsulant (330) serves to further mechanically and electrically protect the electrical connections between the bond pads (108) and the controller that provides the ejection control signals to the rows (FIG. 1, 104) of nozzles.

FIG. 3B depicts a bond pad region of the termination ring (FIG. 1, 102). The bond pads of the fluid ejection device (FIG. 1, 100) are landing pads for electrical connections and include a metal landing pad, which could be formed of Aluminum, Tantalum, and/or Gold with electrical interconnection between the layers. The first layer (328) which may be formed of Tantalum and the second layer (332) which may be formed of Aluminum provide chemical protection for the bond pad. The Tantalum first layer (328) also serves as a barrier between the gold landing pad and the aluminum second layer (332) to prevent issues caused by mixing/ diffusion of the Gold into the Aluminum. Gold also serves as the outer most electrically conductive layer of the bond pad to which the flex beams or wire bonds are attached.

As described above, in this bond pad region the termination ring (FIG. 1, 102) does not include the second metallic layer (FIG. 1, 112). Accordingly, there is no vertical ridge formed in the passivation layer (324) in the vicinity of the bond pads (FIG. 1, 108) and therefore no stringers (FIG. 3A, 326) formed which could result in a short conduction path between the termination ring (FIG. 1, 102) and the bond pads (FIG. 1, 108). As can be seen in FIG. 38, the bond pad includes a number of layers including the first layer (328). The first layer (328) may be formed of a material whose etch process deposits the stringers (FIG. 3A, 326) along an edge of the passivation layer (324) in the vicinity of the second metallic layer (FIG. 1, 112). An example of such a material is Tantalum. Other layers, such as the second layer (332) may be formed of different materials, such as Aluminum that do not leave any such stringers.

Figure 4:
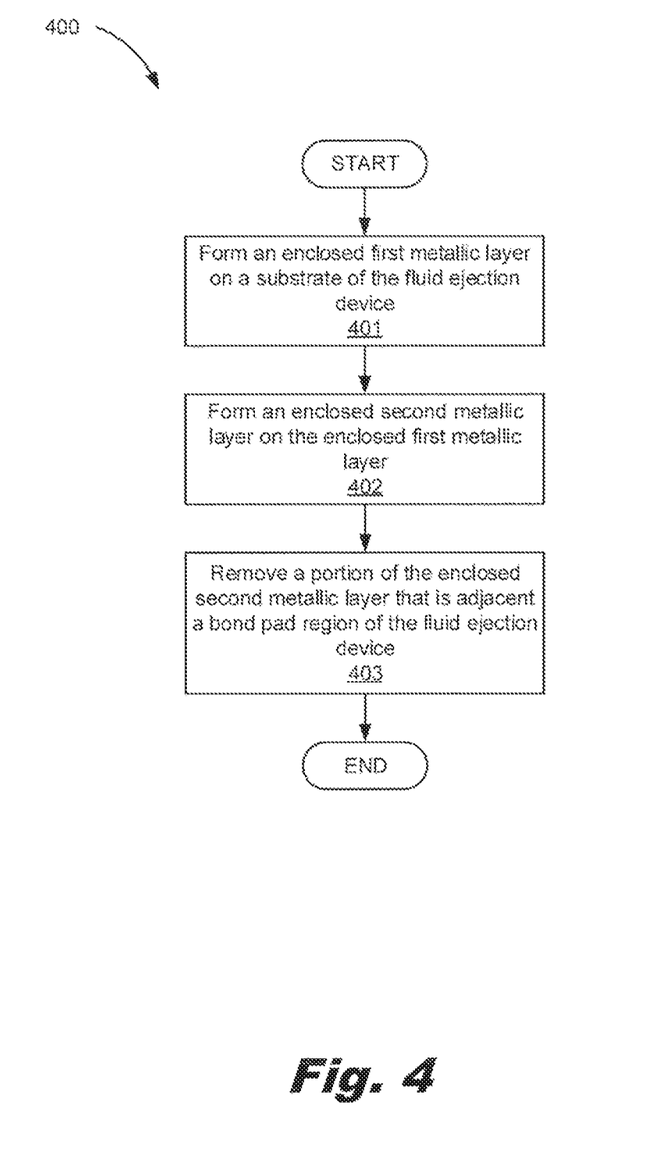
FIG. 4 is a flowchart of a method for forming a fluid ejection device with a gapped termination ring, according to an example of the principles described herein.

FIG. 4 is a flowchart of a method (400) for forming a fluid ejection device (FIG. 1, 100) with a gapped termination ring (FIG. 1, 102), according to an example of the principles described herein. According to the method (400), an enclosed first metallic layer (FIG. 1, 110) is formed (block 401) on a substrate (FIG. 1, 106) of the fluid ejection device (FIG. 1, 100). The first metallic layer (FIG. 1, 110) forms the first part of termination ring (FIG. 1, 102) that electrically and mechanically protects components of the fluid ejection device (FIG. 1, 100) such as nozzles and bond pads (FIG. 1, 108). It is enclosed so as to protect the components from all sides and may be formed of a variety of metals or metal alloys. Forming the enclosed first metallic layer (FIG. 1, 110) may include electrically coupling the first metallic layer (FIG. 1, 110) to the substrate (FIG. 1, 106) on which it is formed. This may be done via etching recesses in the substrate (FIG. 1, 106) and then depositing a material into the recesses. Such contact allows the first metallic layer (FIG. 1, 110) to provide a ground connection for the fluid ejection device (FIG. 1, 100). Formation of the first metallic layer (FIG. 1, 110) may include the deposition of the material that makes up the first metallic layer (FIG. 1, 110), masking of an area that defines the first metallic layer (FIG. 1, 110) and using an etchant to remove material not underneath the mask. The mask may then be removed leaving the first metallic layer (FIG. 1, 100) in a desired pattern.

Next, an enclosed second metallic layer (FIG. 1, 112) is formed (block 402) on the enclosed first metallic layer (FIG. 1, 110). As with the first metallic layer (FIG. 1, 110), the second metallic layer (FIG. 1, 112) may be formed of a variety of different materials. The enclosed second metallic layer (FIG. 1, 112) is formed on top of the first metallic layer (FIG. 1, 110) via a deposition process. Next, a portion of the enclosed second metallic layer (FIG. 1, 112) is removed (block 403). Specifically, that portion of the second metallic layer (FIG. 1, 112) that is immediately adjacent the bond pad region, i.e., the region of the fluid ejection device (FIG. 1, 100) where the bond pads (FIG. 1, 108) are to be formed, may be removed. This may be done via the masking and etching away of a portion of the material that forms the second metallic layer (FIG. 1, 112).

Forming the second metallic layer (FIG. 1, 112) with this gap around the bond pad region of the termination ring (FIG. 1, 102) reduces the likelihood of moisture-related failures and other electrical failures as a shortened conduction path between a bond pad (FIG. 1, 108) and a stringer (FIG. 3, 326) is removed. In other words, when the first layer (FIG. 3, 328) of the bond pad (FIG. 1, 108) is formed after the formation of the termination ring (FIG. 1, 102), a portion of the material that makes up the first layer (FIG. 3, 328) is left in the vicinity of the second metallic layer (FIG. 1, 112). If that stringer material (FIG. 3, 326) were left near the bond pad (FIG. 1, 108), it could cause failure of the entire fluid ejection device (FIG. 1, 100). Accordingly, making a fluid ejection device (FIG. 1, 100) that does not include these stringers (FIG. 3, 326) adjacent to the bond pad region, mechanical robustness is maintained while the likelihood of electrical failure is reduced. In some examples, the enclosed second metallic layer (FIG. 1, 112) is formed at the same time as a base layer of the number of bond pads (FIG. 1, 108)

of the fluid ejection device (FIG. 1, 100). Doing so reduces the number of distinct operations to form the fluid ejection device (FIG. 1, 100).

Figure 5:
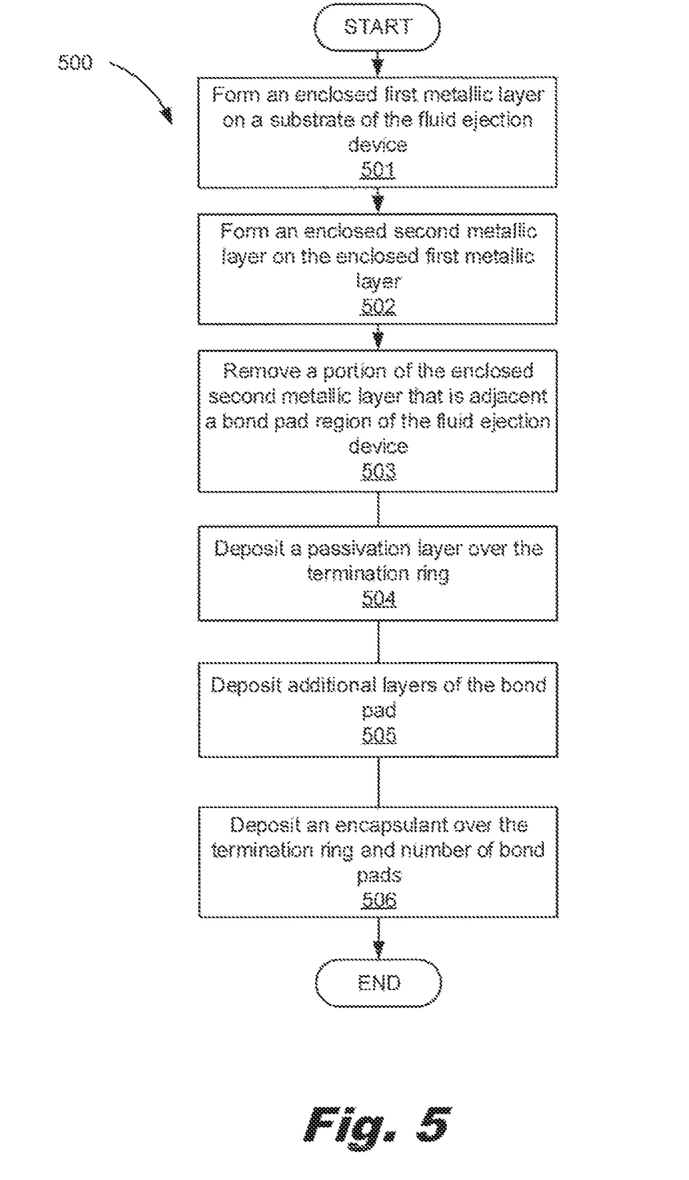
FIG. 5 is a flowchart of a method for forming a fluid ejection device with a gapped termination ring, according to another example of the principles described herein.

FIG. 5 is a flowchart of a method (500) for forming a fluid ejection device (FIG. 1, 100) with a gapped termination ring (FIG. 1, 102), according to another example of the principles described herein. According to the method, an enclosed first metallic layer (FIG. 1, 110) is formed (block 503) on a substrate (FIG. 1, 106) of the fluid ejection device (FIG. 1, 100). This may be performed as described in connection with FIG. 4.

An enclosed second metallic layer (FIG. 1, 112) is then formed (block 502) on the enclosed first metallic layer (FIG. 1, 110). This may be performed as described in connection with FIG. 4. A portion of the enclosed second metallic layer (FIG. 1, 112) that is adjacent a bond pad region is then removed (block 503). This may be performed as described above in connection with FIG. 4.

After the termination ring (FIG. 1, 102) is completed by removing (block 503) the portion of the enclosed second metallic layer (FIG. 1, 112) a passivation layer (FIG. 3, 324) is deposited (block 504) on the termination ring (FIG. 1, 102). The passivation layer provides electrical and chemical passivation to reduce the likelihood of corrosion of the termination ring (FIG. 1, 102). Additional layers can then be deposited (block 505) to form the bond pads. In this example, the additional layers may include a first layer (FIG. 3, 328) that leads to the formation of stringers (FIG. 3, 326). However, due to the removal of the second metallic layer (FIG. 1, 112) in the vicinity of the bond pads (FIG. 1, 108) such stringers are not in that area and thus reduce the amount of failures in this area. An encapsulant (FIG. 3, 330) can then be deposited (block 506) over the termination ring (FIG. 1, 102) and number of bond pads (FIG. 1, 108). The encapsulant (FIG. 3, 330) provides further protection to the bond pads and the electrical connections between the bond pads and the controller that sends control signals to the rows (FIG. 1, 104) of nozzles.

In one example, using such a gapped termination ring provides the electrical, mechanical, and chemical protection to internal components of the fluid ejection device, but also reduces the formation of metal stringers, which could provide a short path to the bond pad, which short path could result in multiple failure mechanism for the fluid ejection device. However, it is contemplated that the devices disclosed herein may address other matters and deficiencies in a number of technical areas.

The preceding description has been presented to illustrate and describe examples of the principles described. This description is not intended to be exhaustive or to limit these principles to any precise form disclosed. Many modifications and variations are possible in light of the above teaching.

What is claimed is:

1. A fluid ejection device comprising:
   a substrate;
   a number of rows of nozzles formed within the substrate to eject fluid;
   a number of bond pads disposed on the substrate and electrically coupled to the number of rows of nozzles;
   a termination ring disposed on the substrate that surrounds the rows of nozzles, wherein, the termination ring comprises:
   a first metallic layer that is an enclosed shape; and
   a second metallic layer disposed on top of the first metallic layer, the second metallic layer comprising a gap positioned adjacent the number of bond pads.

2. The device of claim 1, wherein the first metallic layer and the second metallic layer are formed from a component selected from the group consisting of Aluminum, Aluminum, Tantalum, Aluminum Copper and Tantalum Aluminum.

3. The device of claim 1, further comprising an encapsulant disposed over the number of bond pads and a portion of the termination ring.

4. The device of claim 1, wherein the number of bond pads are disposed along an edge of the substrate.

5. The device of claim 1, wherein the termination ring runs along the number of bond pads.

6. The device of claim 1, wherein the gap is the same length as a length of a region that comprises the number of bond pads.

7. The device of claim 1, further comprising a passivation layer disposed over the termination ring.

8. A method of forming a termination ring on a fluid ejection device, the method comprising:
   forming an enclosed first metallic layer of the termination ring on a substrate of the fluid ejection device;
   forming an enclosed second metallic layer on the enclosed first metallic layer;
   removing a portion of the enclosed second metallic layer that is adjacent a bond pad region of the fluid ejection device to form a gapped second metallic layer of the termination ring.

9. The method of claim 8, wherein the enclosed second metallic layer is formed at the same time as a first layer of a number of bond pads of the fluid ejection device.

10. The method of claim 8, further comprising depositing an encapsulant over the termination ring and a number of bond pads disposed on the fluid ejection device.

11. The method of claim 8, further comprising depositing a passivation layer over the termination ring.

12. The method of claim 8, further comprising depositing additional layers of the bond pad after deposition of the passivation layer.

13. A fluid ejection device comprising:
   a substrate;
   a number of rows of nozzles formed within the substrate to eject fluid;
   a number of bond pads disposed on the substrate to electrically couple the number of rows of nozzles to a controller;
   a termination ring disposed on the substrate that surrounds the rows of nozzles and the number of bond pads to mechanically and electrically protect the number of rows of nozzles, wherein, the termination ring comprises:
   a bond pad region comprising just a first metallic layer; and
   a non-bond pad region comprising the first metallic layer and a second metallic layer disposed on the first metallic layer.

14. The die of claim 13, wherein the first metallic layer and the second metallic layer are formed from a component selected from the group consisting of Aluminum, Aluminum, Tantalum, Aluminum Copper and Tantalum Aluminum.

15. The die of claim 13, further comprising an encapsulant disposed over the number of bond pads and the bond pad region of the die termination ring.

* * * * *